(12) United States Patent (10) Patent No.: US 8,249,275 B1
Tsang et al. (45) Date of Patent: Aug. 21, 2012

(54) MODULATED GAIN AUDIO CONTROL AND ZIPPER NOISE SUPPRESSION TECHNIQUES USING MODULATED GAIN

(75) Inventors: Robin Matthew Tsang, Austin, TX (US); John Christopher Tucker, Austin, TX (US); Scott Allan Woodford, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 663 days.

(21) Appl. No.: 12/493,054

(22) Filed: Jun. 26, 2009

(51) Int. Cl.
*H04B 15/00* (2006.01)
(52) U.S. Cl. ............... 381/94.5; 381/107; 330/129
(58) Field of Classification Search .......... 381/120, 381/121, 56, 57, 58, 94.5, 107; 330/129, 330/279; 700/94
See application file for complete search history.

(56) References Cited

U.S. PATENT DOCUMENTS

| | | | | |
|---|---|---|---|---|
| 4,051,442 | A * | 9/1977 | Yamazaki | 330/281 |
| 5,404,115 | A * | 4/1995 | Johnson | 330/279 |
| 8,126,164 | B2 * | 2/2012 | Bjorn-Josefsen et al. | 381/109 |
| 2009/0220109 | A1 * | 9/2009 | Crockett et al. | 381/107 |

OTHER PUBLICATIONS

"Audio Gain Control Using Digital Potentiometers", Application note 1828, Jan. 2002, US.
"Digital Gain Control with Analog VCAs", Application Note 102, THAT Corporation, Jan. 1999, Milford, MA.

* cited by examiner

*Primary Examiner* — Devona Faulk
*Assistant Examiner* — Friedrich W Fahnert
(74) *Attorney, Agent, or Firm* — Mitch Harris, Atty at Law, LLC; Andrew M. Harris

(57) ABSTRACT

A modulated gain audio control and zipper noise suppression techniques provide reduction in audible artifacts caused by discrete-valued gain changes. The gain of a signal is controlled by modulating between multiple gain values for corresponding time durations, so that a resulting average gain is controlled according to the average of the multiple gain values as weighted by their corresponding time durations. The modulation frequency is above the bandwidth of the signal. Transitions between gain levels are performed by changing the relative proportion of the durations to slowly change the gain according to a transition profile, which may be linear or non-linear. The modulation employed may be pulse-width modulation, or another modulation pattern such as a delta-sigma modulation pattern.

27 Claims, 4 Drawing Sheets

MODULATED GAIN AUDIO CONTROL AND ZIPPER NOISE SUPPRESSION TECHNIQUES USING MODULATED GAIN

BACKGROUND OF THE INVENTION

1. Field of the Invention

The present invention relates generally to control of audio signal gain, and more specifically, to audio signal gain control techniques that modulate between discrete gain values.

2. Background of the Invention

Audio gain control circuits are included in nearly every audio device, for example gain control circuits provide volume control in consumer audio devices such as MP3 players and car and home audio systems, as well as in professional audio devices. Present-day audio gain control is typically performed in steps according to a digital control value, with the size of the steps determining the resolution of the gain adjustment. In analog audio gain control circuits having discrete gain steps selected by a digital control value, e.g., when a switchable resistor ladder is used to set a feedback or input resistor value, or when an otherwise continuous gain control element is controlled with a control signal having discrete steps, a change in gain is audible as a pop when the input signal has significant DC offset and/or the offset changes with the change in gain. The pop will occur even when no audio is present. If an audio signal is present and the gain change is made at any time other than a zero-crossing of the audio signal, a step will also be introduced in the audio signal, also causing an audible pop.

When such a gain control is changed continuously through a number of steps, the result is a sequence of repetitive pops, an artifact that is sometimes referred to as "zipper" noise, due to its resemblance to the sound of operation of a zipper. The repetition rate of the pops is generally below the audible band and therefore heard as clicks, rather than an audible tone.

An offset in the audio signal may be due to a DC-coupled input and offset that is already present in an input signal, or the offset may be produced by the input bias current(s) of a gain stage interacting with the mismatch in resistance at the input node(s). The amplifier may also have a gain-dependent offset. For example, if the amplifier has an output-referenced offset of 10 mV at 0 dB of gain, the offset will jump to 20 mV when the gain is changed to 6 dB, and a "pop" will be produced. In particular, when discrete gain control is provided by switching resistors connected to the input node of an operational amplifier, a variable voltage offset that depends on the gain selection can be expected at the output of the operational amplifier, even when no DC offset is present in the input signal. If DC offset is present in the input signal, then a signal step equal to the gain change multiplied by the signal offset plus any change in offset due to changes in the gain setting resistances will occur when the gain changes, assuming that the AC portion of the audio signal has zero level when the gain changes.

When any of the above-described circuits are used as a volume control or in another type of gain control stage, such as in an audio signal processing codec integrated circuit, zipper noise results when the gain level is changed rapidly between multiple levels. A pop will occur if the gain is changed once, or multiple pops will occur if the gain is changed slowly. In order to mitigate the effects of such gain changes, in applications where the gain change can be synchronized with the signal-zero crossings or when the signal can be muted during gain transitions, large resistors are used to reduce the offset changes, and a large number of discrete gain settings (and therefore a corresponding large number of resistors) are needed to reduce the effect of the pops.

Therefore, it would be desirable to provide an audio gain control circuit in which signal step changes due to gain adjustments do not produce large audible artifacts. It would further be desirable to provide an audio gain control circuit where the number of discrete gain settings can be reduced while maintaining a fine degree of gain control.

SUMMARY OF THE INVENTION

The above stated objective of providing an audio gain stage circuit in which offset changes due to gain adjustments do not provide large audible artifacts and/or in which the number of discrete gain settings can be reduced, is accomplished in a circuit and method. The method is a method of operation of the circuit.

The circuit includes a gain stage with a modulator that controls a gain of a signal according to a gain control value, by modulating between multiple gains for corresponding time durations. The modulation is performed at a rate above the bandwidth of the signal. The resulting gain is an average of the multiple gains weighted by their corresponding durations. By controlling the magnitudes of the multiple gains and/or the corresponding time durations, the gain can be adjusted to gain control values lying between the minimum and maximum of the multiple gains.

In order to reduce pops and zipper noise artifacts, transitions between an existing gain level and the next gain level are performed by performing the modulation between the multiple gain values and adjusting the corresponding durations to change the resulting gain from the existing gain level to the next gain level. A modulator controls the durations according to a transition profile which may be linear or non-linear. The modulator may be a pulse-width modulator, a delta-sigma modulator, or another modulator type. The modulator can be used to control gain such that between discrete levels of gain (including zero gain or "off") any number of controlled gain levels can be set, limited only by the resolution of the modulator. Therefore, the modulation technique of the present invention can be used during transitions ("dynamic" gain changes) only, or at any time to set a "static" gain level.

The foregoing and other objectives, features, and advantages of the invention will be apparent from the following, more particular, description of the preferred embodiment of the invention, as illustrated in the accompanying drawings.

DESCRIPTION OF ILLUSTRATIVE EMBODIMENT

The present invention encompasses modulated gain control techniques for producing gain values between two or more discrete gain settings of a gain stage having a selectable gain by modulating the selection of the gain between the two or more discrete gain settings for corresponding time durations. The resulting gain is the average of the selected gains weighted by their corresponding time durations. The present invention also encompasses techniques for eliminating pops and zipper noise by producing gradual gain transitions by changing the proportions between the time durations according to a transition profile.

Pops are audible artifacts due to a transient in the audio signal, such as when a discrete gain change is made that is not synchronized to a zero-crossing of the audio signal. Zipper noise is a repetitive sequence of pops. Pops or zipper noise can be generated by steps in the signal occurring due to gain changes, and/or due to changes in the output offset of a gain stage that occur when a step change is made in gain. Either type of pop or zipper noise can be reduced or eliminated by the transition technique of the present invention. The above-mentioned offset can be due to a change of input offset as part of the gain change, and/or by the gain step acting on an offset present in the input signal. As used in the present application, the term gain includes gain and attenuation, and the term gain stage is understood to apply to attenuation stages as well. Further, by avoiding synchronization with zero crossings, gain changes can be applied more rapidly. As an example, for a 20 Hz audio signal, a zero-crossing synchronized step in volume can only be applied every 25 ms, and therefore, for example, to apply a change in volume of 100 steps would require 2.5 s. Since the present invention does not require such synchronization, the rate of gain change can be determined, in general, by purely audio considerations.

Figure 1:
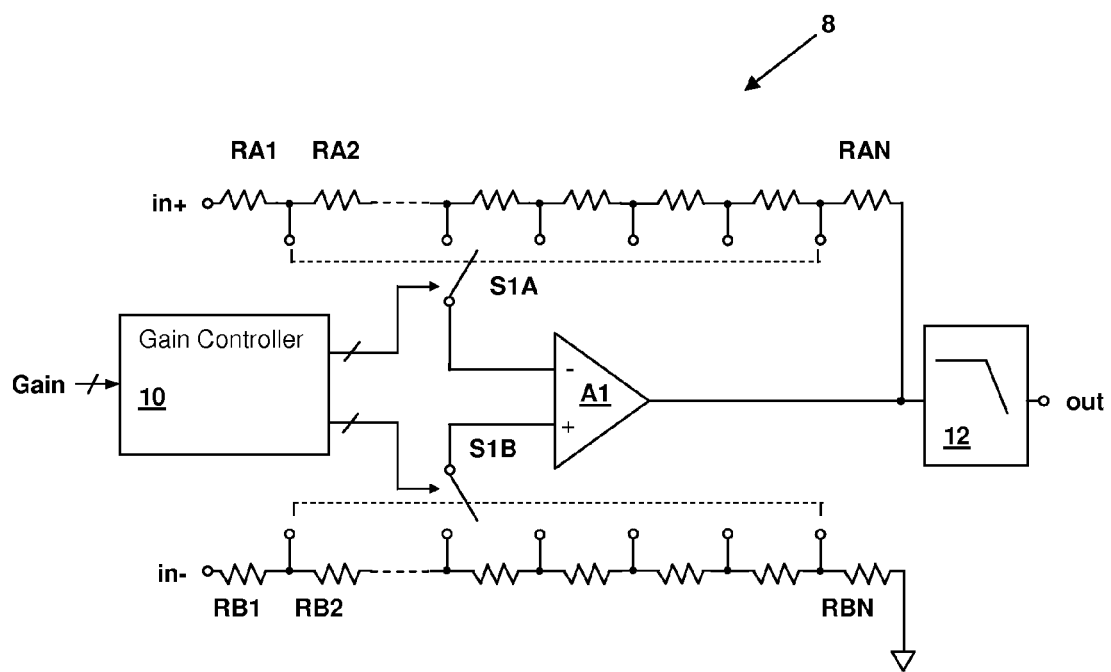
FIG. 1 is a block diagram depicting a controllable gain stage in accordance with an embodiment of the present invention.

Referring now to FIG. 1, a controllable gain stage circuit 8 in accordance with an embodiment of the present invention, is shown. An amplifier A1 receives a differential audio input signal across terminals in+ and in− and multiplies the audio signal by a gain or attenuation factor to generate audio output signal out. An optional lowpass filter 12 is included to remove high-frequency signal components resulting from the modulation, if necessary. Unique to the gain stage circuit of FIG. 1, in accordance with various embodiments of the present invention, is the presence of a gain controller 10 that includes the ability to modulate between multiple gain/attenuation values in order to impose an effective gain that results from an averaging of the multiple gain/attenuation values applied for the different durations, producing a resulting average gain. The multiple gain settings are thereby weighted by their corresponding time durations and combine to produce the resulting average gain. In accordance with other embodiments of the present invention, the relative durations of the time intervals can be adjusted continuously to produce a transition between an existing gain setting and a next gain setting in order to reduce or eliminate pops or zipper noise.

Resistors RA1-RAN provide a resistor chain with a switch position selected by switch element S1A and resistors RB1-RBN provide another resistor chain with a switch position selected by switch element S1B. Switch element S1A and S1B are ganged, i.e., they are generally always set to identical switch positions, so that a differential amplifier is formed having a gain/attenuation magnitude set by the ratio of the resistance between the output of amplifier A1 and the selected switch position and the resistance between the selected switch position and the inverting input of amplifier A1. Therefore the switch position selected by controller 10 sets the gain of gain stage 8. In the depicted embodiment, gain controller 10 modulates the gain factor at a high frequency well above the audio range. The modulation generates high frequency components outside of the audible range. The high frequency components may be filtered by including feedback capacitor networks for band-limiting the operation of amplifier A1 (not shown), by relying on an inherent roll-off in the frequency response of amplifier A1, or by an optional low-pass filter 12 included in the signal path at the output of amplifier A1. Alternatively the inaudible high-frequency modulation components may be allowed to proceed to the output of gain stage 8.

The result of the operation described above is that a gain setting provided to controller 10, will cause controller 10 to select at least two gain values and modulate between them to produce an average resulting gain that is equal to the gain setting. For gain transitions, changes in the relative proportions of the durations for which at least two gain values are applied are introduced gradually. Generally, two gain values are used: a present gain value and a next gain value. The proportion of the new gain value in a given time interval set by the time durations for the new gain value can be varied from 0% to 100% in steps as fine as the modulation technique within gain controller 10 permits. Without the modulating function of gain controller 10, a single step of 100% is the only gain change that could be made. Therefore, the present invention provides for reducing the number of resistors and switch positions required for a given number of gain steps, because intermediate gain steps can be generated by modulating between multiple gain values. The present invention also provides that physically smaller resistors can be used to implement the gain control ladders, since the transition technique of the present invention reduces or eliminates pops and zipper noise that had previously dictated offset limits that determine the size of the resistors. Without the techniques of the present invention, physically larger resistors must be used to reduce mismatches that cause circuit offsets, or the pops and zipper noise must be tolerated. The result can be a substantial die area savings, since the resistors can occupy a significant amount of the total die area. Also, even without changing the number of switch positions or resistor sizes, the present invention relaxes the need to mute or synchronize with the input audio to avoid pops that occur during gain changes while an audio signal is present.

Modulating between the two gain values is sufficient and provides simple determination of which gain values are to be used for a gain transition. However, the present invention contemplates other combinations of two or more gain values in a given "intermediate" gain step produced by the modulation and also "static" gain settings. For example, the gain value might be modulated between the present value, the new value and a midpoint value between the present value and the new value. Alternatively, gain levels other than the present and new value could be used, with the proportional durations in the modulation being adjusted according to whatever factors are needed to yield the dynamically changing gain profile between the present value and the new value. As such, the gain stage might be effectively turned "off" (or set to a high attenuation value) to produce a set of proportional durations for at least two other gain values that sum to less than 100% of a time interval. For example, if a change in gain from 2 to 3 were required, instead of modulating between a gain setting of 2 and a gain setting of 3, gain controller 10 could modulate between a gain value of 3, a gain value of 4 and a gain value of zero (off). A proportion of the corresponding durations of 0, 50% and 50%, respectively, could be used to produce the initial gain setting of 2, since the resultant weighted average gain is given by: $0*3+0.5*4+0.5*0=2$, with a gradual change to 100%, 0% and 0%, giving a resulting weighted average gain of: $1*3+0*4+0*2=3$. For gain settings between transitions, or otherwise unchanging gain values, a "fine" control can be produced by modulating between two adjacent gain values in a gain stage having a reasonably large number of gain settings, or in an extreme example, all gain values can be produced by modulating between a minimum and maximum gain value. The minimum gain value can be zero (off).

Yet another embodiment of the invention includes selecting intermediate switch positions in the circuit of FIG. 1 when the gain change is larger than just the gain change provided by switching to an adjacent switch position, for example by shifting the two gain values used in the modulation between adjacent pairs of switch positions until the gain is modulating between the new gain value and the adjacent value in the direction of the previous gain value. The durations in the modulation can be swept from 0-100% between each pair of values until 100% of the new gain value is asserted.

Different types of modulation may be employed within gain controller 10. The modulation and modulator as described herein refers to the modulation that determines the control signal that selects the switch position of switches S1A and S1B, which may be pulse-width modulation producing a continuous monotonic change in the gain value. Another modulation technique that may be employed is delta-sigma modulation (DSM) technique, which can help spread the frequencies of any audible artifacts caused by the discrete nature of the steps in the durations in combination with the discrete steps in gain. Therefore, it is understood that the gain applied to the audio signal is modulated by changing the gain value according to the selected modulation technique, but the audio signal itself is not PWM or DSM modulated in the conventional sense by the techniques of the present invention.

Figure 2A:
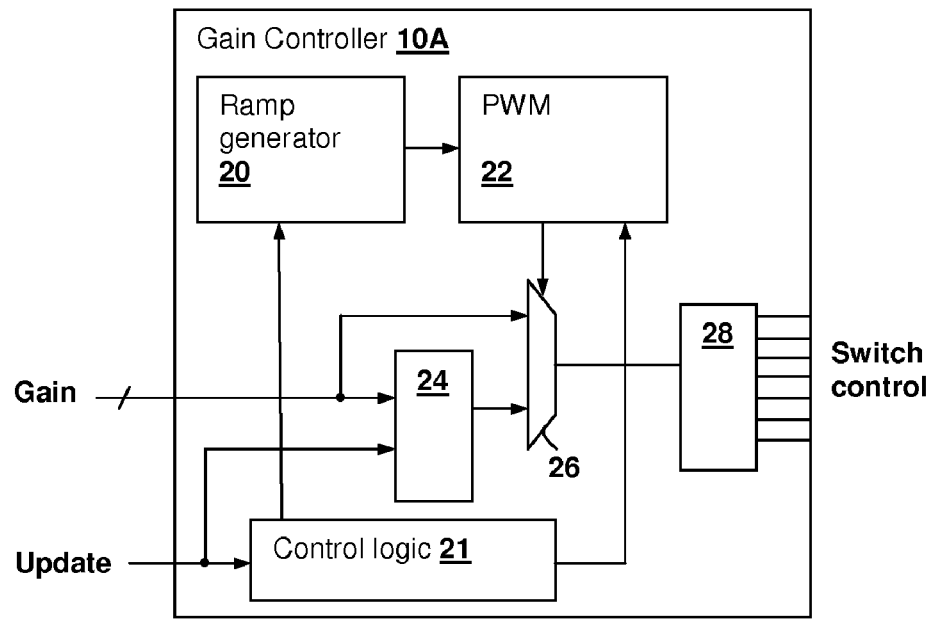
FIG. 2A is a schematic diagram depicting a gain controller 10A that may be used to implement gain controller 10 of FIG. 1, in accordance with an embodiment of the present invention.

Referring now to FIG. 2A, a gain controller 10A that may be used to implement gain controller 10 of FIG. 1, is shown in accordance with an embodiment of the invention. Gain controller 10A, includes a ramp generator 20 that generates the gain change profile when triggered by control logic 21 in response to assertion of an update signal Update. Update signal Update also latches the previous value of a gain value Gain into a latch 24 when update signal Update is de-asserted. A pulse-width modulator (PWM) 22 receives the output of ramp generator 20, and selects between the previous gain value stored in latch 24 and gain value Gain, which now has a new value provided in conjunction with a trailing edge of update signal Update. As mentioned above, other types of modulator may be used, such as a DSM, without any other change, since the DSM would still follow the profile generated by ramp generator 20 to provide the desired gain change, on average. For a static gain setting the output of ramp generator 20 can be held at a fixed value.

PWM 22 performs the selection of the gain values applied to the audio signal by operating the control input to a multiplexer 26 with a PWM signal having proportions described above that are determined by the current value of the output of ramp generator 20. The one-shot gain control profile generated by ramp generator may be linear, or may assume a non-linear shape tailored to further reduce audio artifacts, or to provide a psycho-acoustically smoother gain change. Once the ramp has completed the transition, the output of PWM 22 will remain in the state that selects gain value Gain onto the output of multiplexer 26. The output of multiplexer 26 is provided to a switch control logic 28, which asserts the proper combination of switch control signals Switch control to set the gain corresponding to the value at the output of multiplexer 26, which is changing dynamically during gain transitions.

Figure 2B:
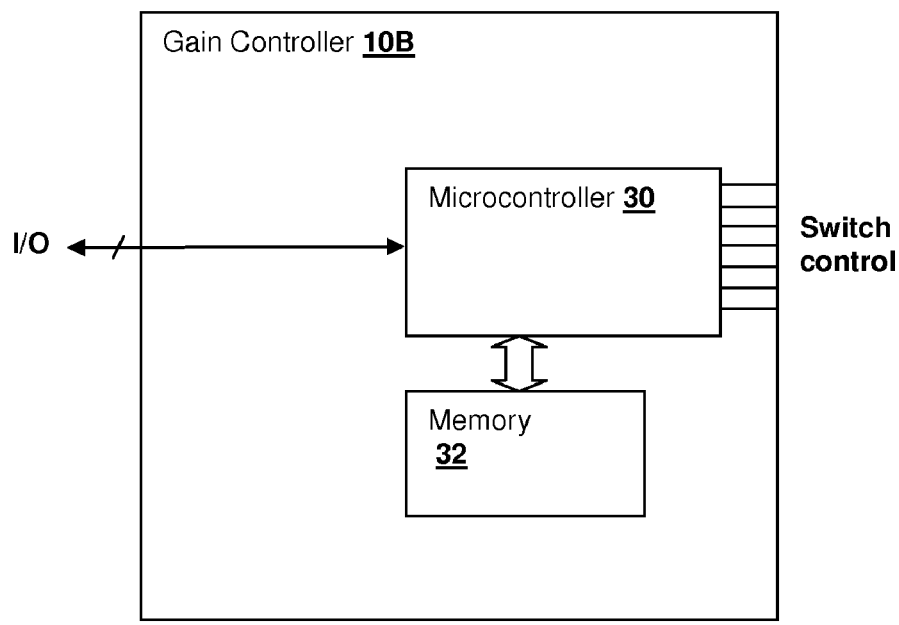
FIG. 2B is a schematic diagram depicting a gain controller 10B that may be used to implement gain controller 10 of FIG. 1, in accordance with another embodiment of the present invention.

Referring now to FIG. 2B, a gain controller 10B in accordance with another embodiment of the invention is shown, which may alternatively be used to implement gain controller 10 of FIG. 1. A microcontroller 30 provides switch control signals Switch control according to program instructions in memory 32, which can perform any of the functions illustrated above by logic circuits, and memory 32 can be used to retain the previous gain value for use by the program. Input output interface signals I/O provide the gain values and update indications, so that microcontroller 30 can modulate switch control signals Switch control temporarily while the gain is changed, or continuously when a static gain setting is produced by modulating between multiple gain settings.

Figure 3:
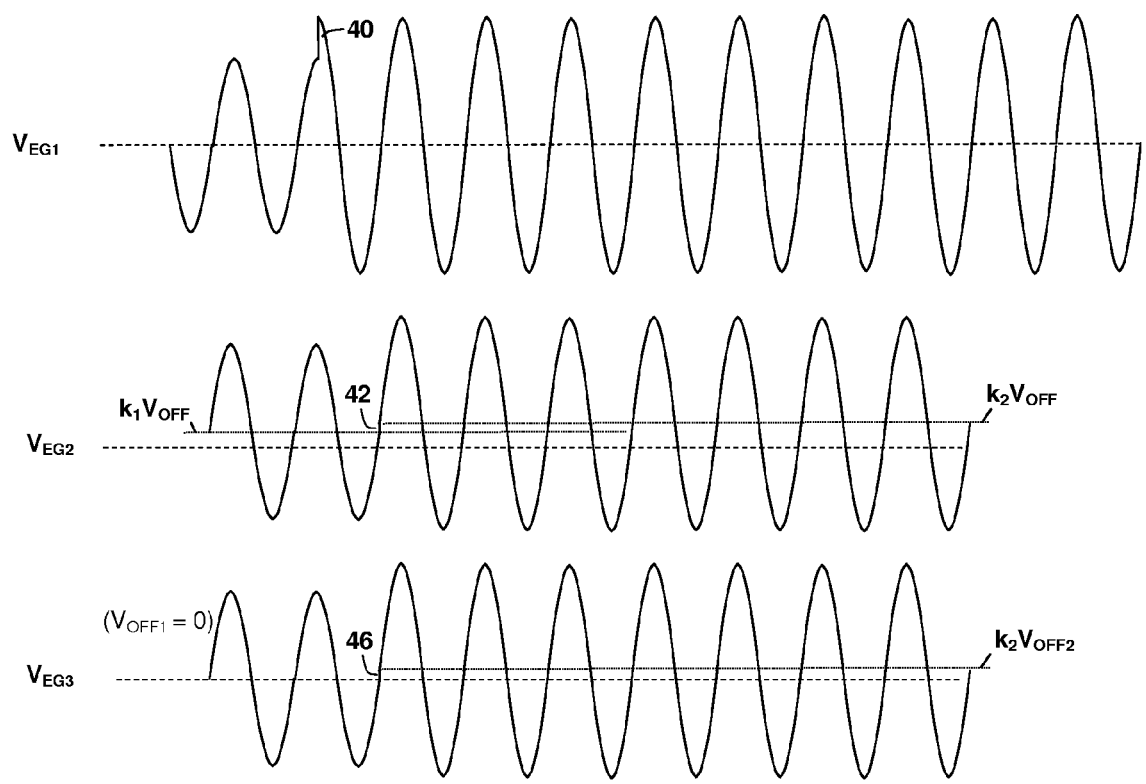
FIG. 3 and FIG. 4 are signal waveform diagrams illustrating operation of the controllable gain stage of FIG. 1.

Referring now to FIG. 3, signal waveforms illustrating the above-described operation are shown. Waveform $V_{EG1}$ illustrates a signal having zero-offset, but having a gain change step of 40% (i.e., the gain is increased to 1.4 times its previous value) imposed at a worst-case peak amplitude. The gain change step causes a step 40 in the waveform $V_{EG1}$, which will be audible as a pop, and if multiple changes are made close together in such a manner, zipper noise occurs. Waveform $V_{EG2}$ illustrates a signal having a gain change step imposed at a zero crossing, but there is an offset $V_{OFF}$ present in the signal, in which offset $V_{OFF}$ is first multiplied by previous gain factor $k_1$ and then multiplied by new gain factor $k_2$, causing an amplitude step 42 of $V_{OFF}$ $(k_2-k_1)$, which is also audible as a pop and will generate zipper noise when repeated rapidly. Finally, Waveform $V_{EG3}$ illustrates a signal starting with a first offset $V_{OFF1}$, illustrated here as zero and having a second offset $V_{OFF2}$, for example, caused by changes in the impedances at the summing nodes of amplifier A1 in FIG. 1, when a different resistor is selected. The change in gain and offset produces a step 46 equal to $V_{OFF2}k_2-V_{OFF1}k_1$, which in the present example is $V_{OFF2}k_2$.

Figure 4:
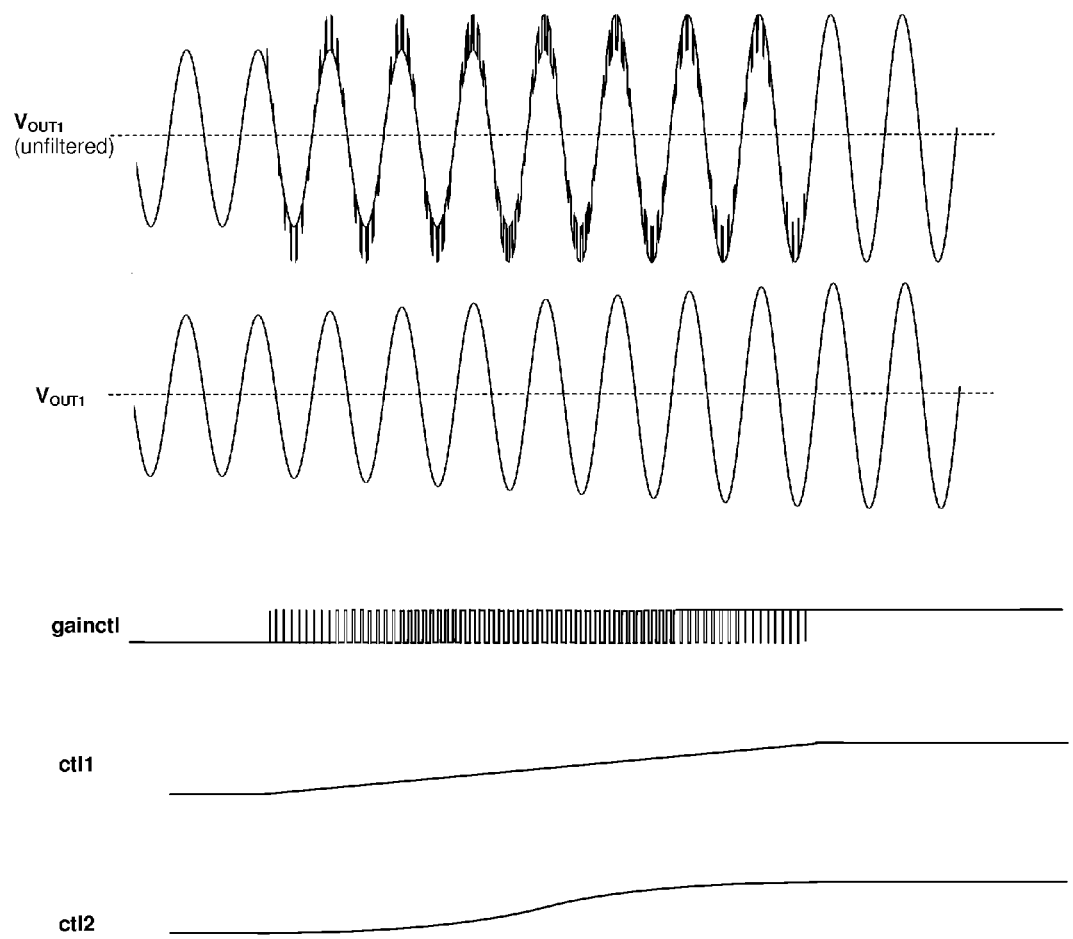

Exemplary waveforms $V_{EG1}$, $V_{EG2}$ and $V_{EG3}$ are all illustrative of conditions that cause pops and zipper noise, which will occur without the modulated gain control of the present invention. Referring now to FIG. 4, application of the techniques of the present invention are illustrated with respect to the gain change condition and input condition for the waveform illustrated in waveform $V_{EG1}$. A smooth transition region is generated in waveform $V_{OUT1}$, by action of the controlled gain modulation of the present invention. Waveform $V_{OUT1}$ illustrates an exemplary waveform at output out of FIG. 1, which has been filtered by low pass filter 12.

An "unfiltered" version of waveform $V_{OUT1}$ is illustrated, which might not actually be present anywhere in the circuit if the bandwidth of amplifier A1 is limited to frequencies below the modulation frequency. The steps in the unfiltered version of waveform $V_{OUT1}$ are due to the modulation of the gain between the previous and the next gain value, and the output of PWM 22 is illustrated as a gain control signal gainctl. As shown, gain control signal gainctl initially selects the (previous) input gain value, modulates between the previous gain value and the new gain value after the input gain value changes and during the transition in gain, and finally again selects the (new) input gain value continuously after the transition is complete. Signal ctrl1 illustrates the output of ramp generator 20 for a linear profile, and signal ctrl2 illustrates a non-linear control profile. For "static" gain settings, gain control signal gainctl can assume a constant duty cycle for PWM or a constant average duty cycle for DSM or other technique. The high frequency changes present in the unfiltered version of waveform $V_{OUT1}$ will be present continuously in such a case.

While the invention has been particularly shown and described with reference to the preferred embodiments thereof, it will be understood by those skilled in the art that the foregoing and other changes in form and details may be made therein without departing from the spirit and scope of the invention.

What is claimed:

1. A method of controlling amplitude of a signal, comprising:
   receiving a gain control value to apply to the signal to generate a resultant output signal; and
   modulating a selectable gain of a gain stage by selecting between multiple gain settings according to durations corresponding to the multiple gain settings to produce a resulting average gain equal to the gain control value, wherein at least one of the durations and the multiple gain settings are determined from the gain control value.

2. The method of claim 1, wherein the signal is an audio signal, and wherein the modulating controls the volume of the audio signal according to the resulting average gain value.

3. The method of claim 2, wherein the method further comprises adjusting the corresponding durations to cause a transition between a previous gain control value and a new gain control value over a transition interval, whereby the resulting average gain is changed slowly, reducing or eliminating the audibility of pops or zipper noise in the resultant output signal.

4. The method of claim 1, further comprising:
   receiving a new gain control value; and
   adjusting a proportion between the corresponding durations to cause a transition between a previous gain control value and the new gain control value.

5. The method of claim 4, further comprising setting the selectable gain of the gain stage to a value corresponding to the new gain control value until another gain control value is received.

6. The method of claim 4, wherein the resultant output signal has a new DC offset for the new gain control value that differs from a previous DC offset for the previous control value, and wherein the adjusting adjusts the proportion to reduce the audible effect of a change from the previous DC offset to the new DC offset.

7. The method of claim 4, wherein the adjusting adjusts the proportion linearly during the transition.

8. The method of claim 4, wherein the adjusting adjusts the proportion according to a non-linear profile during the transition.

9. The method of claim 4, wherein the modulating modulates the gain setting between a first gain setting corresponding to the present gain control value for a first duration and a second gain setting corresponding to the new gain control value for a second duration, and wherein the adjusting adjusts the proportion such that at the end of the transition, the first duration is zero.

10. The method of claim 1, wherein the durations are averages of a high frequency modulation.

11. The method of claim 10, wherein the high frequency modulation is generated by a delta-sigma modulator.

12. A circuit for controlling the amplitude of a signal, the circuit comprising:
   a gain control block for applying a selectable gain to the signal according to a selected gain setting; and
   a control circuit for receiving a gain control value and setting the selected gain setting of the gain control block, wherein the control circuit includes a modulator for modulating the selected gain setting between multiple gain settings for corresponding durations, wherein at least one of the durations and the multiple gain settings are determined from the gain control value, whereby a resulting gain is applied to the signal equal to an average of the multiple gain settings weighted according to their corresponding durations.

13. The circuit of claim 12, wherein the signal is an audio signal, and wherein the control circuit adjusts the volume of the audio signal.

14. The circuit of claim 13, wherein the control circuit adjusts the corresponding durations to cause a transition between a previous gain control value and a new gain control value over a transition interval, whereby the resulting gain is changed slowly, reducing or eliminating the audibility of pops or zipper noise at an output of the gain control block.

15. The circuit of claim 12, wherein the control circuit receives a new gain control value, and wherein the control circuit adjusts a proportion between the durations to cause a transition between a previous gain control value and the new gain control value.

16. The circuit of claim 15, wherein subsequent to completing the transition, the control circuit a gain setting corresponding to the new gain control value to the gain control block until another gain control value is received.

17. The circuit of claim 15, wherein an output of the gain control block has a new DC offset for the new gain control value that differs from a previous DC offset for the previous gain control value, and wherein the control circuit adjusts the proportion to reduce the audible effect of a change from the previous DC offset to the new DC offset.

18. The circuit of claim 15, wherein the control circuit adjusts the proportion linearly during the transition.

19. The circuit of claim 15, wherein the control circuit adjusts the proportion according to a non-linear profile during the transition.

20. The circuit of claim 15, wherein the modulator modulates the control value between a first gain setting corresponding to the present gain control value for a first duration and a second gain setting corresponding to the new gain control value for a second duration, and wherein the control circuit adjusts the proportion such that at the end of the transition, the first duration is zero.

21. The circuit of claim 13, wherein the durations are averages of a high frequency modulation generated by a modulator.

22. The circuit of claim 21, wherein the modulator is a delta-sigma modulator.

23. A digital signal processor comprising a processor core for executing program instructions, a memory for storing the program instructions, and wherein the program instructions comprise program instructions for controlling the amplitude of a signal, the program instruction comprising program instructions for:
   receiving a gain control value to apply to the signal to generate a resultant output signal;
   determining durations for multiple selectable gain settings of a gain that is applied to the signal to generate the resultant output signal;
   selecting from among the multiple selectable gain settings and applying the selected gain setting to the signal; and
   modulating the selection of the gain setting while repeating the selecting, wherein the selection is modulated among the multiple gain settings values according to corresponding durations to produce a resulting average gain equal to the gain control value.

24. The digital signal processor of claim 23, wherein the program instructions further comprise program instructions for adjusting a proportion between the corresponding durations to cause a transition between a previous gain control value and a new gain control value.

25. The digital signal processor of claim 24, wherein the program instructions for modulating modulate the selecting between a first gain setting corresponding to the present value for a first duration and a second gain setting corresponding to the new control value for a second duration, and wherein the adjusting adjusts the proportion such that at the end of the transition, the first duration is zero.

26. A non-transitory computer program product comprising a computer-readable storage medium storing program instructions for execution by a digital signal processor, the program instruction comprising program instructions for:

receiving a gain control value to apply to the signal to generate a resultant output signal;

determining durations for multiple selectable gain settings of a gain that is applied to the signal to generate the resultant output signal;

selecting from among the multiple selectable gain settings and applying the selected gain setting to the signal; and modulating the selection of the gain setting while repeating the selecting, wherein the selection is modulated among the multiple gain settings values according to corresponding durations to produce a resulting average gain equal to the gain control value.

27. The computer program product of claim 26, wherein the program instructions further comprise program instructions for adjusting a proportion between the corresponding durations to cause a transition between a previous gain control value and a new gain control value.

* * * * *